United States Patent [19]

Hanawa

[11] Patent Number: 4,931,733
[45] Date of Patent: Jun. 5, 1990

[54] METHOD AND APPARATUS FOR DETERMINING SHIM COIL CURRENT IN NUCLEAR MAGNETIC RESONANCE IMAGING

[75] Inventor: Masatoshi Hanawa, Tochigi, Japan

[73] Assignee: Kabushiki Kaisha Toshiba, Kawasaki, Japan

[21] Appl. No.: 278,716

[22] Filed: Dec. 2, 1988

[30] Foreign Application Priority Data

Dec. 14, 1987 [JP] Japan .................. 62-314252

[51] Int. Cl.$^5$ ............................................. G01R 33/20
[52] U.S. Cl. ............................................... 324/318
[58] Field of Search .................. 324/318, 319, 320; 335/299

[56] References Cited

U.S. PATENT DOCUMENTS 4,618,827 10/1986 Redington et al. ............... 324/309
4,623,844 11/1986 Macovski ............................ 324/320

Primary Examiner—Tom Noland
Assistant Examiner—Kevin D. O'Shea
Attorney, Agent, or Firm—Foley & Lardner, Schwartz, Jeffery, Schwaab, Mack, Blumenthal & Evans

[57] ABSTRACT

A method and an apparatus for nuclear magnetic resonance imaging, using a shim coil which adjusts a static magnetic field to improve the homogeneity of the static magnetic field, capable of determining an appropriate amount of current to flow through the shim coil in accordance with a nuclear magnetic resonance signal due to water, in order to achieve an accurate adjustment of the homogeneity of the static magnetic field. The determination of the amount of current may be made by selecting current parameters for which a half-width of the nuclear magnetic resonance signal spectrum due to water is the smallest. The determination of the amount of current may be made by selecting current parameters for which a peak value of the nuclear magnetic resonance signal spectrum due to water is the largest.

4 Claims, 4 Drawing Sheets

METHOD AND APPARATUS FOR DETERMINING SHIM COIL CURRENT IN NUCLEAR MAGNETIC RESONANCE IMAGING

BACKGROUND OF THE INVENTION

1. Field of the Invention

The present invention relates to a method and an apparatus for nuclear magnetic resonance imaging using a shim coil which adjusts a static magnetic field to improve the homogeneity of the static magnetic field and, more particularly, to a mechanism for determining an amount of current to be supplied to the shim coil in such a nuclear magnetic resonance apparatus.

2. Description of the Background Art

As is well-known, in a nuclear magnetic resonance imaging apparatus (referred hereafter as MRI apparatus) nuclear magnetic resonance signals (referred hereafter as NMR signals) are obtained from a region of interest in a body to be examined by irradiating the region with radio frequency excitation pulses (referred hereafter as RF pulses) under the presence of a static magnetic field surrounding the region, and image reconstructions or the spectrum analyses are carried out on a basis of obtained NMR signals.

In a case of image reconstruction, a high-resolution image is obtainable when the homogeneity of the static magnetic field in the region of interest is within the range of 1 to several ppm. However, the homogeneity of the static magnetic field can easily be disturbed beyond this range by the presence of the body to be examined.

To cope with this situation, the adjustment of the homogeneity of the static magnetic field by superposing an extra magnetic field produced by a shim coil placed in the static magnetic field with various currents flowing therethrough an amount of which determines the strength of the extra magnetic field is commonly employed. A passive use of the shim coil in which the induced dipole field appearing as the shim coil is placed in the static magnetic field is utilized for adjusting the static magnetic field can also be found in practice. The adjustment of the current flowing through shim coil has an advantage of being capable of changing the strength of the extra magnetic field and thereby adjusting the homogeneity of the static magnetic field in an active manner.

In such an adjustment of the current flowing a shim coil, it is convenient to control the amount of the current flowing in the shim coil in accordance with the NMR signals being collected, so that in a conventional MRI apparatus equipped with such a current flowing shim coil the amount of the current is determined in accordance with the NMR signals collected from the particular species of atoms selected for the purpose of the specific type of examination to be carried out, regardless of the species selected.

As a result, it has been difficult to achieve an accurate adjustment when the NMR signals are weak which occurs, for instance, in a case in which the selected species is phosphorus ($^{31}p$).

On the other hand, even in a case such as one in which the selected species is hydrogen ($^1H$) for which the NMR signals are strong, when the body to be examined is a human being the NMR signals of the hydrogen contains contributions from both water and fat which possess different resonant frequencies, so that accurate adjustment was also difficult to achieve.

Thus, in a conventional MRI apparatus it has often been difficult to achieve accurate adjustment of the homogeneity of the static magnetic field.

SUMMARY OF THE INVENTION

It is therefore an object of the present invention to provide a method and an apparatus for nuclear magnetic resonance imaging capable of determining an appropriate amount of current to flow in a shim coil in order to achieve an accurate adjustment of the homogeneity of the static magnetic field.

According to one aspect of the present invention there is provided a nuclear magnetic resonance imaging apparatus, comprising: magnet means for producing a static magnetic field; probe coil means for irradiating radio frequency pulses on a body to be examined and detecting nuclear magnetic resonance signals from the body; shim coil means for adjusting the homogeneity of the static magnetic field by generating an extra magnetic field to be superposed on the static magnetic field; and means for determining an amount of current to be supplied to the shim coil means in accordance with a nuclear magnetic resonance signal due to water.

According to another aspect of the present invention there is provided a method of nuclear magnetic resonance imaging, comprising the steps of: (a) producing a static magnetic field around a body to be examined; (b) irradiating the body with radio frequency pulses suitable for exciting hydrogen atoms; (c) detecting nuclear magnetic resonance signals due to hydrogen atoms; (d) separating a nuclear magnetic resonance signal due to water in the nuclear magnetic resonance signals due to hydrogen atoms; (e) determining an amount of current to be supplied to a shim coil means in accordance with the nuclear magnetic resonance signal due to water; (f) adjusting the homogeneity of the static magnetic field by an extra magnetic field to be superposed on the static magnetic field generated by the shim coil means; (g) irradiating the body with radio frequency pulses suitable for exciting a particular species of atoms to be used in examining the body; (h) detecting nuclear magnetic resonance signals due to the particular species; and (i) analyzing the detected nuclear magnetic resonance signals.

Other features and advantages of the present invention will become apparent from the following description taken in conjunction with the accompanying drawings.

DETAILED DESCRIPTION OF THE PREFERRED EMBODIMENTS

Figure 1:
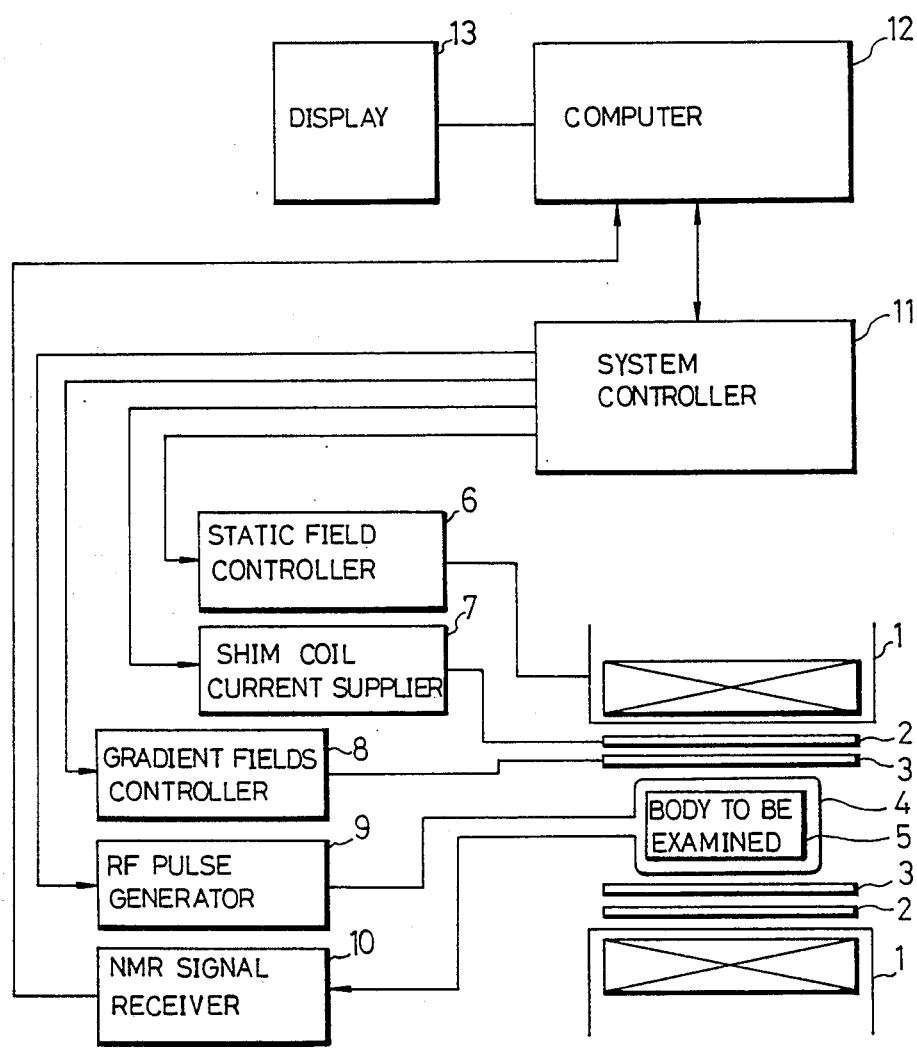
FIG. 1 is a schematic block diagram of one embodiment of an MRI apparatus according to the present invention.

Referring now to FIG. 1, there is shown one embodiment of an MRI apparatus according to the present invention.

This MRI apparatus comprises a main magnet 1 for generating a static magnetic field, a shim coil 2 for adjusting the homogeneity of the static magnetic field, gradient field coils 3 for generating gradient magnetic fields, a probe coil 4 for irradiating RF pulses on and detecting NMR signals from a body to be examined 5, a static field controller 6 for controlling the generation of the static magnetic field by the main magnet 1, a shim coil current supplier 7 for supplying currents to the shim coil 2, a gradient fields controller 8 for controlling the generation of the gradient magnetic fields by the gradient fields coils 3, an RF pulse generator 9 for generating RF pulses to be irradiated from the probe coil 4, an NMR signal receiver 10 for receiving the NMR signals detected by the probe coil 4, a system controller 11 for controlling operations of the static field controller 6, the shim coil current supplier 7, the gradient fields controller 8, and the RF pulse generator 9, a computer 12 for carrying out necessary computations with the NMR signals received by the NMR signal receiver 10 for the purpose of image reconstructions or spectrum analyses, and a display 13 for displaying results of the imaging by the MRI apparatus.

The operation of this MRI apparatus, so far as normal nuclear magnetic resonance imaging is concerned, is the same as that in a conventional MRI apparatus so that explanation of this part of the operation is not given here. The operation of this MRI apparatus differs, however, from that of a conventional one in determination of an amount of current to be supplied to the shim coil 2. Namely, in this MRI apparatus the appropriate amount of current to be supplied to the shim coil 2 is determined with respect to an NMR signal from hydrogen regardless of the species of atoms to be utilized in an actual examination of the body 5.

Figure 2:
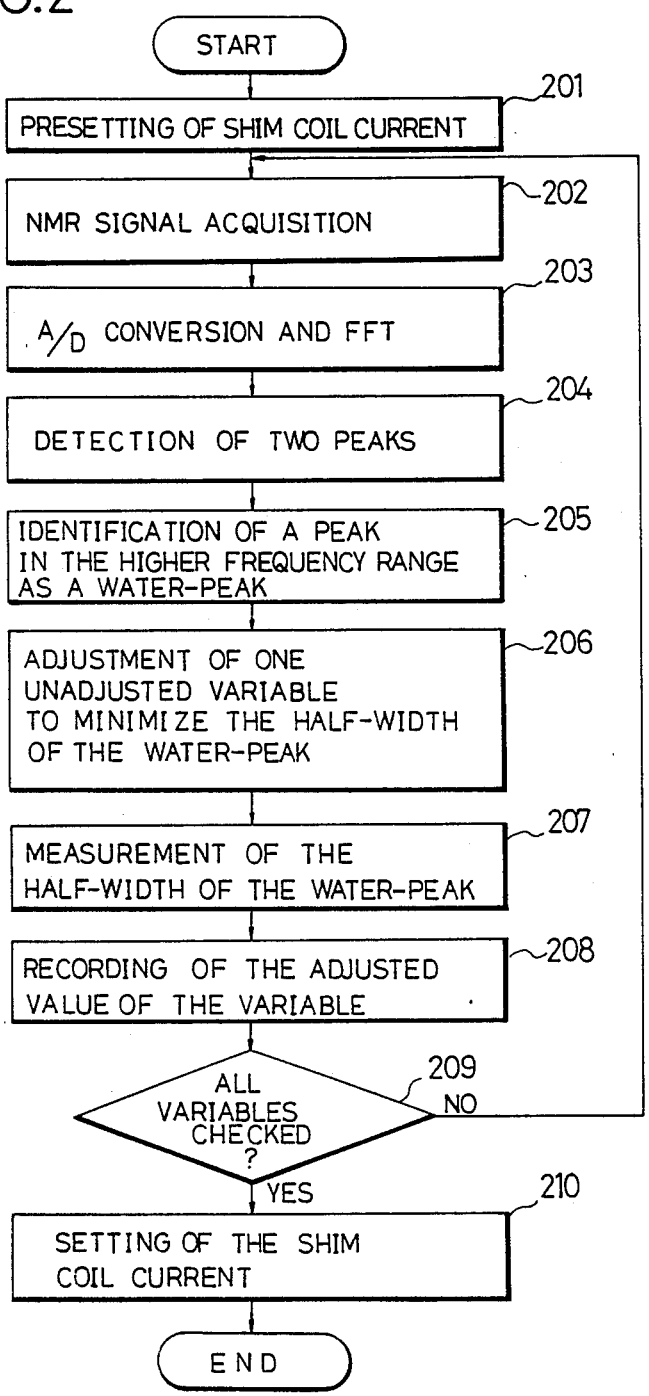
FIG. 2 is a flow chart of the magnetic field homogeneity adjustment operation by the MRI apparatus shown in FIG. 1.

Referring now to FIG. 2, the magnetic field homogeneity adjustment operation of this MRI apparatus will be explained with subsidiary references to FIGS. 3 to 6.

At the step 201, a shim coil current for the shim coil 2 to be supplied by the shim coil current supplier 7 is preset to a predetermined initial amount, and then at the step 202, the NMR signals from hydrogen atoms are collected under the appropriate gradient fields and RF pulses suitably arranged to excite hydrogen atoms.

Figure 3A:
FIGS. 3(A) and 3(B) are qualitative graphs of NMR signals of hydrogen from water as functions of time.
Figure 3B:
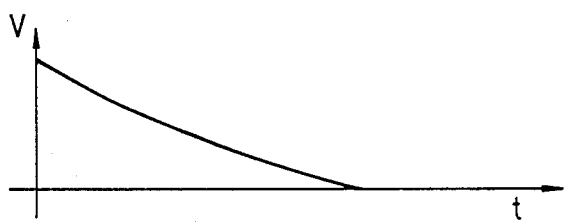

When the body 5 contains water as an only source of hydrogen NMR signals, a collected NMR signal will appear qualitatively as shown in FIG. 3(A) where the amplitude of the NMR signal is plotted as a function of time. As shown, it consists only of a high frequency signal envelope due to a phase discrimination performed by the NMR signal receiver 12. The shape of the NMR signal can be altered by changing a time constant $T^*_2$ given by the expression:

$$T^*_2 = 1/\pi\gamma\Delta B_0 = 1/\pi f_{\frac{1}{2}} < < T_2$$

where $\gamma$ is a magnetic moment, $\Delta B_0$ is a homogeneity of magnetic field, $f_{\frac{1}{2}}$ is a half-width of spectrum, and $T_2$ is a transverse relaxation time which is normally longer than $T^*_2$. Thus by taking this time constant $T^*_2$ longer, the collected NMR signal will appear as shown in FIG. 3(B), in which case the homogeneity of the magnetic field can be improved.

Figure 4:
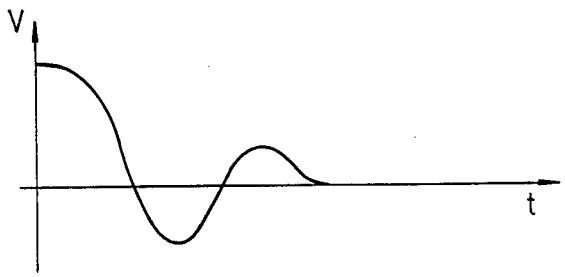
FIG. 4 is a qualitative graph of an NMR signal of hydrogen from a source containing both water and fat as a function of time.
Figure 5:
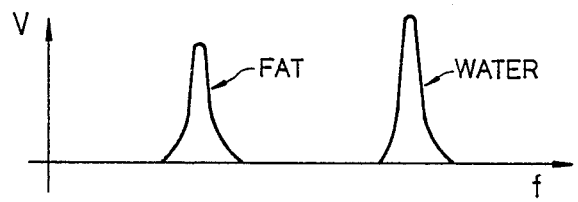
FIG. 5 is a qualitative graph of a Fourier transformed NMR signal of hydrogen from a source containing both water and fat as a function of frequency.

On the other hand, when the body 5 is a human being both fat as well as water serve as sources of the NMR signals due to hydrogen atoms, so that the collected NMR signals in this case will appear as shown in FIG. 4 in a form of a beating envelope. In this case, the collected NMR signals can be represented by Fourier transforming the graph of FIG. 4 as one shown in FIG. 5, where a peak in the higher frequency range can be identified with the NMR signal due to water whereas a peak in the lower frequency range can be identified with that due to fat.

At the step 203, the collected NMR signals are converted into digital signals and the Fast Fourier transform (FFT) is performed with these digitalized NMR signals. Then, at the step 204, two peaks due to water and fat are recognized, of which one in the higher frequency range is identified as that due to water at the step 205.

Figure 6A:
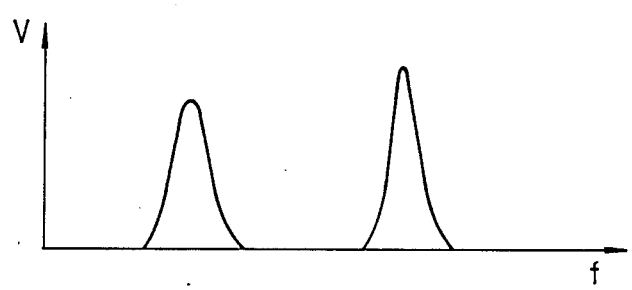
FIGS. 6(A), 6(B) and 6(C) are qualitative graphs of Fourier transformed NMR signals of hydrogen from a source containing both water and fat as functions of frequency, obtained with different amounts of shim coil currents.
Figure 6B:
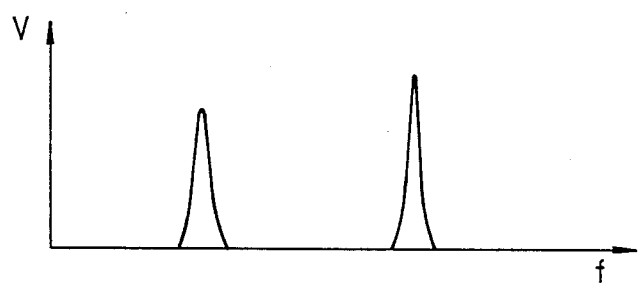
Figure 6C:
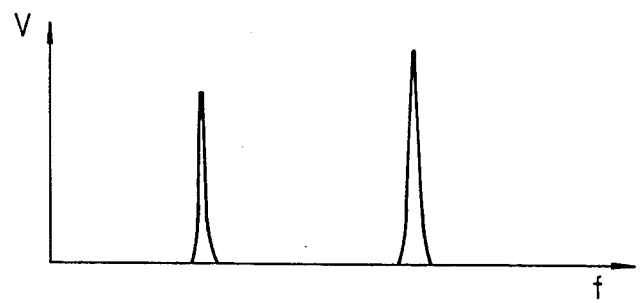

Now, in this MRI apparatus, an appropriate amount is determined for the shim coil current by varying it from its preset value, and by selecting one for which the half-width of the NMR signal spectrum due to water (referred hereafter as the water-peak) is the smallest. This is accomplished in this embodiment by adjusting each one of variables in an expression which gives the shim coil current within a predetermined range, finding the value for each variable which minimizes the half-width while keeping the other variables fixed, and setting the shim coil current to the amount given by those values of variables just found. Exemplary views of the successive NMR signal spectrums obtained by this procedure are shown in FIGS. 6(A), 6(B), and 6(C), in which the half-width of the NMR signal spectrum becomes narrower from FIG. 6(A) to FIG. 6(C).

Accordingly, at the step 206 one of the unadjusted variables is adjusted such that the half-width of the water-peak is minimized with respect to this variable while keeping the other variable fixed, and then at the step 207 the half-width of the water peak is measured, and the adjusted value of this variable is subsequently recorded in a memory at the step 208. Then, at the step 209 whether all the variables are checked is judged so that the steps 202 to 208 are repeated until all the variables are properly adjusted. When all the variables are properly adjusted, the shim coil current is set to the amount given by the adjusted values of the variables at the step 210, and the process terminates.

As a result, in this embodiment of an MRI apparatus it is possible to determine the shim coil currents with great accuracy regardless of the species of atoms with which the examination by the MRI apparatus is to be made.

It is possible to modify the above embodiment by utilizing the property of the NMR signal spectrum, that the area under the spectrum curve is constant, which is not related to the homogeneity of the magnetic field. As a consequence of this property, the half-width of the peak and the peak value are inversely proportional to each other, so that the half-width of the peak utilized in the above embodiment in determining the appropriate amount of current to be supplied to the shim coil 2 can be replaced by the peak value. In other words, the shim coil currents which produce greater homogeneity of the magnetic field can be selected by choosing one for which the peak value is the largest.

Besides these, many modifications and variations of this embodiment may be made without departing from the novel and advantageous features of the present invention. Accordingly, all such modifications and variations are intended to be included within the scope of the appended claims.

What is claimed is:

1. A nuclear magnetic resonance imaging apparatus, comprising:
    magnet means for producing a static magnetic field;
    probe coil means for irradiating radio frequency pulses on a body to be examined and for detecting nuclear magnetic resonance signals from the body;
    shim coil means for adjusting the homogeneity of the static magnetic field by generating an extra magnetic field to be superposed on the static magnetic field; and
    means for determining an amount of current to be supplied to the shim coil means in accordance with a nuclear magnetic resonance signal due to water by selecting a current for which a half-width of a nuclear magnetic resonance signal spectrum due to water is the smallest.

2. A method of nuclear magnetic resonance imaging, comprising the steps of:
    (a) producing a static magnetic field around a body to be examined;
    (b) irradiating the body with radio frequency pulses suitable for exciting hydrogen atoms;
    (c) detecting nuclear magnetic resonance signals due to hydrogen atoms;
    (d) separating a nuclear magnetic resonance signal due to water from nuclear magnetic resonance signals due to hydrogen atoms;
    (e) determining an amount of current to be supplied to a shim coil in accordance with the nuclear magnetic resonance signal due to water by selecting a current for which a half-width of a nuclear magnetic resonance signal spectrum due to water is the smallest;
    (f) adjusting the homogeneity of the static magnetic field by an extra magnetic field, to be superposed on the static magnetic field, generated by the shim coil;
    (g) irradiating the body with radio frequency pulses suitable for exciting a particular species of atoms to be used in examining the body; and
    (h) detecting nuclear magnetic resonance signals due to the particular species.

3. A method of nuclear magnetic resonance imaging, comprising the steps of:
    (a) producing a static magnetic field around a body to be examined;
    (b) irradiating the body with radio frequency pulses suitable for exciting hydrogen atoms;
    (c) detecting nuclear magnetic resonance signals due to hydrogen atoms located within the body;
    (d) separating a nuclear magnetic resonance signal due to water from nuclear magnetic resonance signals due to hydrogen atoms in a form other than water;
    (e) determining an amount of current to be supplied to a shim coil in accordance with the nuclear magnetic resonance signal due to water;
    (f) adjusting the homogeneity of the static magnetic field by an extra magnetic field, to be superposed on the static magnetic field, generated by the shim coil; and
    (g) irradiating the body with radio frequency pulses suitable for exciting a particular species of atoms to be used in examining the body; and
    wherein at step (e) the amount of current is determined by selecting a current for which a half-width of a nuclear magnetic resonance signal spectrum due to water is the smallest.

4. A method of nuclear magnetic resonance imaging, comprising the steps of:
    (a) producing a static magnetic field around a body to be examined;
    (b) irradiating the body with radio frequency pulses suitable for exciting hydrogen atoms;
    (c) detecting nuclear magnetic resonance signals due to hydrogen atoms located within the body;
    (d) separating a nuclear magnetic resonance signal due to water from nuclear magnetic resonance signals due to hydrogen atoms in a form other than water;
    (e) determining an amount of current to be supplied to a shim coil in accordance with the nuclear magnetic resonance signal due to water;
    (f) adjusting the homogeneity of the static magnetic field by an extra magnetic field, to be superposed on the static magnetic field, generated by the shim coil; and
    (g) irradiating the body with radio frequency pulses suitable for exciting a particular species of atoms to be used in examining the body; and
    wherein step (e) includes the following steps:
    adjusting each one of a plurality of variables of an expression for shim coil current within a predetermined range; and
    determining a value for each variable which minimizes one of a half-width of a nuclear magnetic resonance signal spectrum and a peak value of a nuclear magnetic resonance signal spectrum, while keeping other variables fixed.

* * * * *